(12) United States Patent
Bindseil et al.

(10) Patent No.: US 11,662,405 B2
(45) Date of Patent: May 30, 2023

(54) SYSTEM AND METHOD OF COIL DESIGN TO REDUCE MAGNETIC COUPLING

(71) Applicant: SYNAPTIVE MEDICAL INC., Toronto (CA)

(72) Inventors: Geron Andre Bindseil, Toronto (CA); Chad Tyler Harris, Toronto (CA)

(73) Assignee: SYNAPTIVE MEDICAL INC., Toronto (CA)

( * ) Notice: Subject to any disclaimer, the term of this patent is extended or adjusted under 35 U.S.C. 154(b) by 240 days.

(21) Appl. No.: 16/990,198

(22) Filed: Aug. 11, 2020

(65) Prior Publication Data

US 2021/0048494 A1 Feb. 18, 2021

Related U.S. Application Data

(60) Provisional application No. 62/885,615, filed on Aug. 12, 2019.

(51) Int. Cl.
| | | |
|---|---|---|
| G01R 33/38 | (2006.01) | |
| G01R 33/381 | (2006.01) | |
| G06F 30/10 | (2020.01) | |

(52) U.S. Cl.
CPC ....... *G01R 33/3802* (2013.01); *G01R 33/381* (2013.01); *G06F 30/10* (2020.01)

(58) Field of Classification Search
CPC .............. G01R 33/3802; G01R 33/381; G01R 33/3858; G06F 30/10; G06F 30/17
See application file for complete search history.

(56) References Cited

U.S. PATENT DOCUMENTS

| | | | |
|---|---|---|---|
| 2008/0164878 A1 | 7/2008 | Morich et al. | |
| 2010/0268514 A1* | 10/2010 | Liu | G01R 33/385 703/2 |
| 2016/0178718 A1* | 6/2016 | Bindseil | G01R 33/385 324/322 |

FOREIGN PATENT DOCUMENTS

WO   WO-2016090453   6/2016

OTHER PUBLICATIONS

Poole, M.; Weiss, P.; Lopez, H. S.; Ng, M. & Crozier, S. Minimax current density coil design Journal of Physics D: Applied Physics, 2010, 43, 095001 (Year: 2010).*

Chen, Guang et al. "A new method of decoupling for gradient systems in MRI." 2013 6th International Conference on Biomedical Engineering and Informatics. IEEE, 2013. [Abstract].

(Continued)

*Primary Examiner* — Daniel R Miller
(74) *Attorney, Agent, or Firm* — Perry + Currier

(57) ABSTRACT

A method of manufacturing an electromagnet coil for use in a magnetic resonance imaging (MRI) system includes: generating a coil surface representation defining a surface to contain the electromagnet coil; defining a set of performance metric functions, the set including a mutual inductance function defining mutual inductance between the electromagnet coil and a second electromagnet coil; defining a performance functional based on the coil surface representation and the set of performance metric functions; optimizing the performance functional; generating a current density pattern over the coil surface representation based on the optimized performance functional; and obtaining coil windings defining the electromagnet coil from the current density pattern.

17 Claims, 7 Drawing Sheets

(56) References Cited

OTHER PUBLICATIONS

Poole, Michael, Chapter 5; IBEM Coil Design, "Improved equipment and techniques for dynamic shimming in high field MRI", 2007.

Peterson, Justin, et al. "Development of a gradient and shim insert system for marmoset imaging at 9.4 T." Proceedings of the 26th Annual Meeting ISMRM. vol. 4421. 2018.

* cited by examiner

SYSTEM AND METHOD OF COIL DESIGN TO REDUCE MAGNETIC COUPLING

CROSS-REFERENCE TO RELATED APPLICATION

This application claims priority from U.S. provisional patent application No. 62/885,615, filed Aug. 12, 2019, the contents of which is incorporated herein by reference.

FIELD

The specification is directed generally to magnetic resonance imaging ("MRI") systems, and more particularly to a system and method of coil design to reduce magnetic coupling between coils.

BACKGROUND

Magnetic resonance imaging (MRI) systems make use of various combinations of electromagnets to impose magnetic fields on target tissues (e.g. of a human subject), producing detailed images of soft tissues such as the brain, muscles, and the like. To capture images, the above-mentioned electromagnets are controlled to generate various fields with predefined shapes, strengths, and the like.

The electromagnets in an MRI system are disposed within a common housing, generally in close physical proximity to one another. The electromagnets may therefore interfere with one another under certain conditions. For example, a pair of electromagnets may induce current in one another (referred to as magnetic coupling, or mutual inductance), which is typically not desirable in MRI applications, as such coupling can lead to imaging artifacts.

SUMMARY

An aspect of the specification provides a method of manufacturing an electromagnet coil for use in a magnetic resonance imaging (MRI) system, including: generating a coil surface representation defining a surface to contain the electromagnet coil; defining a set of performance metric functions, the set including a mutual inductance function defining mutual inductance between the electromagnet coil and a second electromagnet coil; defining a performance functional based on the coil surface representation and the set of performance metric functions; optimizing the performance functional; generating a current density pattern over the coil surface representation based on the optimized performance functional; and obtaining coil windings defining the electromagnet coil from the current density pattern.

Another aspect of the specification provides a computing device for design of an electromagnet coil for use in a magnetic resonance imaging (MRI) system, the computing device including: a memory; and a processor configured to: generate a coil surface representation defining a surface to contain the electromagnet coil; define a set of performance metric functions, the set including a mutual inductance function defining mutual inductance between the electromagnet coil and a second electromagnet coil; define a performance functional based on the coil surface representation and the set of performance metric functions; optimize the performance functional; generate a current density pattern over the coil surface representation based on the optimized performance functional; and obtain coil windings defining the electromagnet coil from the current density pattern.

A further aspect of the specification provides a non-transitory computer-readable medium storing a plurality of instructions executable by a processor of a computing device to: generate a coil surface representation defining a surface to contain an electromagnet coil for use in a magnetic resonance imaging (MRI) system; define a set of performance metric functions, the set including a mutual inductance function defining mutual inductance between the electromagnet coil and a second electromagnet coil; define a performance functional based on the coil surface representation and the set of performance metric functions; optimize the performance functional; generate a current density pattern over the coil surface representation based on the optimized performance functional; and obtain coil windings defining the electromagnet coil from the current density pattern.

BRIEF DESCRIPTIONS OF THE DRAWINGS

Embodiments are described with reference to the following figures, in which.

DETAILED DESCRIPTION

Figure 1:
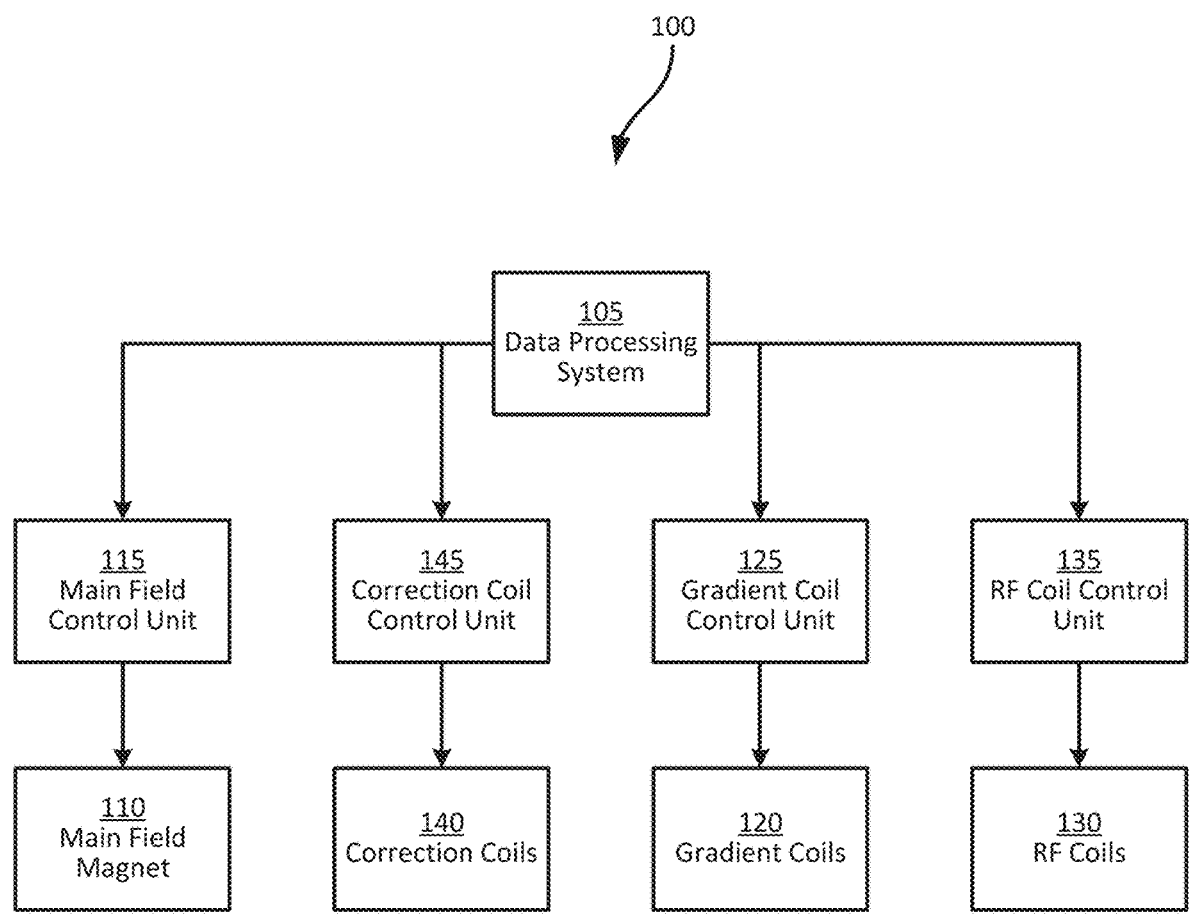
FIG. 1 is a block diagram of functional subsystems of a magnetic resonance imaging system in accordance with an implementation.

FIG. 1 shows a block diagram of an example magnetic resonance imaging (MRI) system 100, which may be used to generate images of magnetic resonance (MR) signals from protons, such as hydrogen atoms in an object. In medical applications of MRI, signals of interest include MR signals from water and fat, the major hydrogen-containing components of biological tissues.

As shown in FIG. 1, the system 100 includes a data processing system 105. The data processing system 105 can include one or more output devices such as a display, one or more input devices such as a keyboard and a mouse, and one or more processors connected to a memory (e.g. a combination of volatile and non-volatile components), The data processing system 105 can also include one or more interfaces adapted for communication and data exchange with the other components of the MRI system 100.

The MRI system 100 includes a plurality of components for generating and controlling magnetic fields. In particular, in the illustrated example, the system 100 includes main field magnet 110. The main field magnet 110 can be implemented as a permanent magnet, a superconducting magnet, or a resistive magnet, or the like. The main field magnet 110 is operable to produce a substantially uniform main magnetic field having a strength B0 and a direction along an axis. The main magnetic field is used to create an imaging volume within which target nuclei, such as the above-mentioned protons in Hydrogen within water and fat, are magnetically aligned in preparation for a scan. The system 100 can include a main field control unit 115 in communication with data processing system 105 to control the operation of the main field magnet 110.

The MRI system 100 can further include gradient coils 120, to encode spatial information in the main magnetic field along, for example, three perpendicular gradient axes. The size and configuration of the gradient coils 120 can be such that they produce a controlled and uniform linear gradient. The magnetic fields produced by the gradient coils 120, in combination and/or sequentially, can be superimposed on the main magnetic field such that selective spatial excitation of objects within the imaging volume can occur. In addition to allowing spatial excitation, the gradient coils 120 can attach spatially specific frequency and phase information to the atomic nuclei placed within the imaging volume, allowing the resultant MR signal to be reconstructed into a useful image. A gradient coil control unit 125 in communication with the data processing system 105 can be used to control the operation of the gradient coils 120.

The MRI system 100 can also include additional electromagnets, such as correction coils 140. The correction coils 140 can include shim coils, a uniform field offset coil, and/or any other suitable corrective electromagnets. A set of actively-driven shim coils, for example, may be controlled to match spherical harmonic field distributions to second or greater order. The correction coils can be controlled, e.g. by a correction coil control unit 145, to correct field distortions introduced when objects are placed within or around the system 100.

The MRI system 100 can also include radio frequency (RF) coils 130. The RF coils 130 are used to establish an RF magnetic field with a strength B1 to excite the atomic nuclei or "spins". The RF coils 130 can also detect signals emitted from the "relaxing" spins within the object being imaged. Accordingly, the RF coils 130 can be implemented in the form of separate transmit and receive coils, or a combined transmit and receive coil with a switching mechanism for switching between transmit and receive modes.

The RF coils 130 can be integrated near the main field magnet 110 bore. Alternatively, the RF coils 130 can be implemented in closer proximity to the object to be scanned, such as the head of a human subject, and can take a shape that approximates the shape of the object, such as a close-fitting helmet. An RF coil control unit 135 in communication with the data processing system 100 can be used to control the operation of the RF coils 130.

As will be apparent to those skilled in the art, various control sequences can be applied to the system 100 to produce MR images. For example, to produce a proton density-weighted image, the main field magnet 110 is controlled to apply the main field to the target object (e.g. patient tissue), partially polarizing Hydrogen protons in the object placed in the imaging volume. The protons are then excited with appropriately tuned RF radiation via contort of the RF coils 130, forming an RF magnetic field. Finally, weak RF radiation signal from the excited protons is detected as an MR signal, as the protons "relax" from the magnetic interaction. The frequency of the detected MR signal is proportional to the magnetic field to which the target protons are subjected. Cross-sections of the object from which to obtain signals can be selected by producing a magnetic field gradient (via control of the gradient coils 120) across the object so that magnetic field values of the main magnetic field can be varied within the object. Given that the signal frequency is proportional to the varied magnetic field created, the variations allow the data processing system 105 to assign a particular signal frequency and phase to a location in the object. Accordingly, sufficient information can be found in the obtained MR signals to construct a map of the object in terms of proton presence. Since proton density varies with the type of tissue, tissue variations can be mapped as image contrast variations after the obtained signals are processed.

The coils 110, 120, 130, and 140 may interfere with one another in operation (including interference between two distinct correction coils 140 or between two distinct gradient coils 120, for example). As noted earlier, the interference may include mutual inductance between pairs of coils. For example, operation of a first shim coil may induce current in a second shim coil. Under certain conditions, the induced current in the second shim coil may be sufficient to disrupt the operation of the second shim coil, such that the magnetic field produced by the second shim coil deviates from the desired magnetic field.

MRI systems 100 in which coils such as the correction coils 140 and/or the gradient coils 120 are asymmetrical may be particularly prone to mutual inductance between coils. Asymmetrical coils may be implemented for systems specifically designed to scan the head of a patient, for example (rather than the entire body of the patient).

Figure 2A:
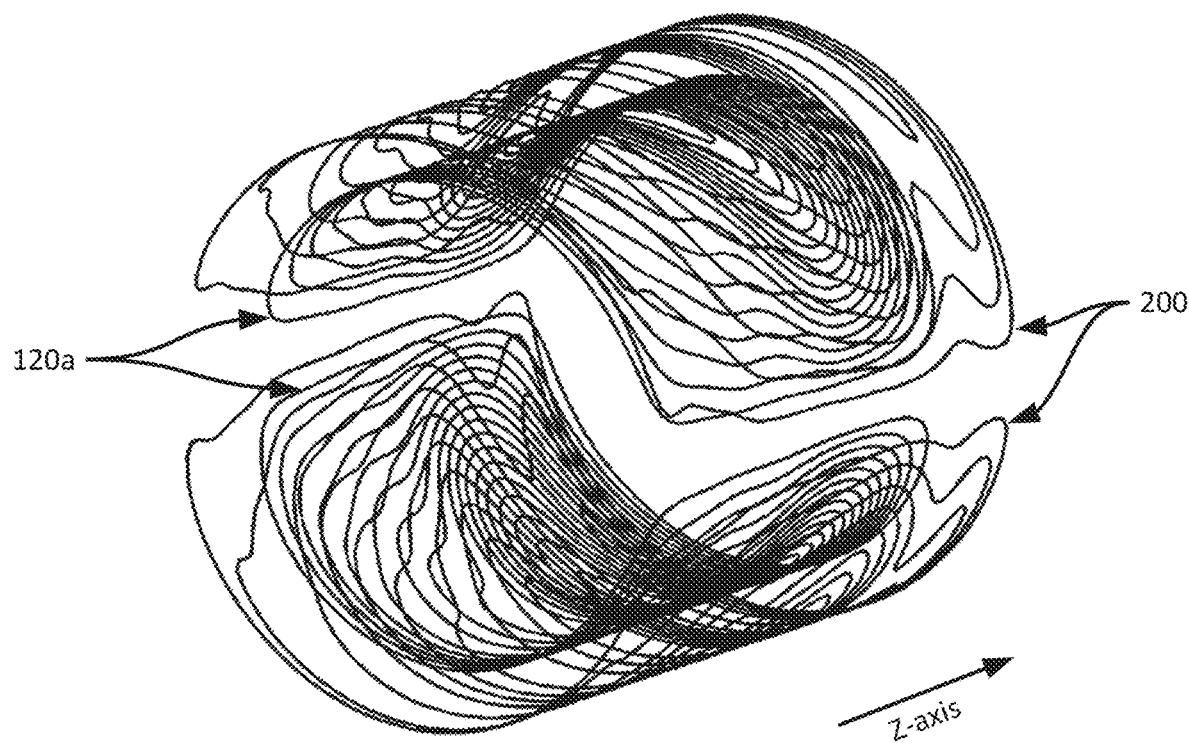
FIG. 2A is a diagram illustrating a gradient coil wire pattern that is asymmetric along the longitudinal direction with one spiral per layer.

For example, as shown in FIG. 2A, gradient coils 120 that are asymmetric along the longitudinal direction (labelled as the Z axis) can have wire patterns with single spirals 120a (which may also be referred to as 'thumbprints') for each side of the coil. In the illustrated example, two additional coils 200 are shown, which form portions of a shield coil corresponding to the primary coil.

In addition, mutual inductance may arise (even in systems 100 with symmetrical coils) as a result of deviations in the installation and/or manufacture of coils. Such deviations may be within acceptable tolerance ranges, but may nevertheless lead to a degree of mutual inductance between some coils that can reduce image quality.

To mitigate or eliminate mutual inductance, the control units 115, 125, 135, and 145 can be provided with amplifiers (e.g. current-controlled amplifiers) with sufficient capacity (e.g. voltage and bandwidth capability) to drive the connected coils to the desired performance even in the presence of induced electromotive forces (EMF). Deploying amplifiers with operational headroom to counteract induced EMF, however, may increase the cost and/or complexity of the system 100.

Mutual inductance may also be mitigated by implementing additional electromagnets (e.g. additional correction coils 140). However, such additional coils further increase the cost and complexity of the system 100, and moreover may be vulnerable to mutual inductance themselves as a result of the manufacturing and/or assembly tolerances mentioned above.

In contrast with the above approaches, in which additional electromagnets and/or control hardware is provisioned, a computing device is provided that implements various functionality to account for mutual inductance between coils in the design stage of the system 100. In particular, as will be discussed below in greater detail, the computing device is configured to generate a layout (e.g. windings defining an electromagnet coil) for at least one electromagnet that mitigates mutual inductance between that electromagnet and another electromagnet.

Figure 2B:
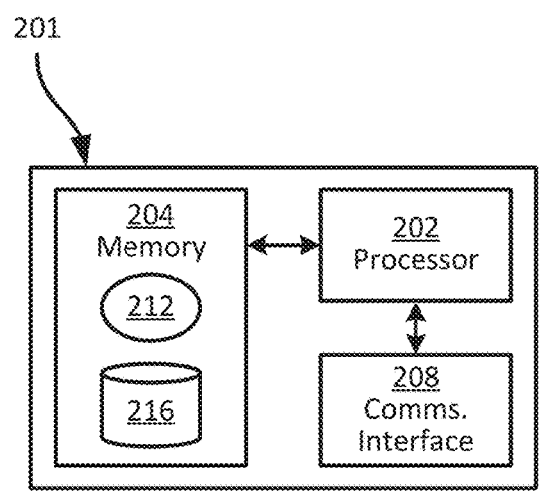
FIG. 2B is a block diagram illustrating certain internal components of a computing device for electromagnetic coil design.

Turning to FIG. 2B, certain internal components of an example computing device 201 is illustrated. The computing device 201 includes a special-purpose controller, such as a processor 202 (e.g. at least one central processing unit or CPUs, at least one graphics processing unit or GPU, or the like). The processor 202 is interconnected with a non-transitory computer readable storage medium, such as a memory 204. The memory 204 includes a combination of volatile memory (e.g. Random Access Memory or RAM) and non-volatile memory (e.g. read only memory or ROM, Electrically Erasable Programmable Read Only Memory or EEPROM, flash memory). The processor 202 and the memory 204 each comprise one or more integrated circuits. In some examples, the computing device can be implemented in a distributed manner, e.g. across a plurality of processors and associated memory circuits.

The memory 204 stores computer readable instructions for execution by the processor 202. In particular, the memory 204 stores a coil design application 212 which, when executed by the processor 202, configures the processor 202 to process various information to generate design parameters for at least one electromagnet of the system 100. The information processed via execution of the application 212 can include data defining previously designed electromagnet coils, which may be stored in a repository 216 in the memory 204.

Those skilled in the art will appreciate that the functionality implemented by the processor 202 via the execution of the application 212 may also be implemented by one or more specially designed hardware and firmware components, such as FPGAs, ASICs and the like in other embodiments.

The computing device 201 can also include an input assembly such as a keyboard, a mouse, or any other suitable combination of input devices. The computing device 202 can further include an output assembly, such as a display or the like.

Figure 3:
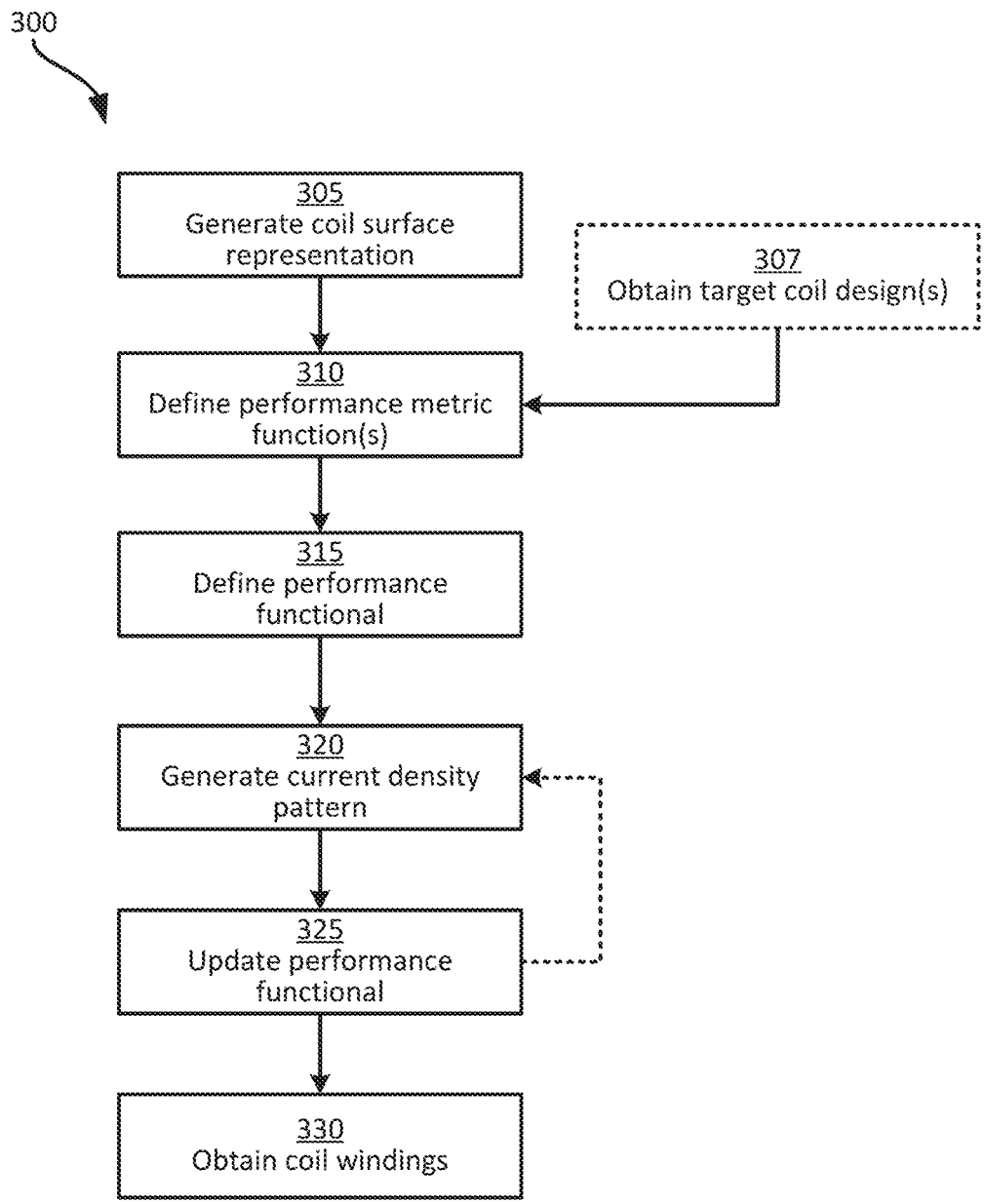
FIG. 3 is a flowchart of a method of coil design to reduce magnetic coupling.

Turning to FIG. 3, a method 300 of coil design to mitigate mutual inductance is illustrated. The method 300 will be described below in conjunction with its performance by the computing device 201, e.g. to design at least one coil for the system 100. The method 300 is performed at the computing device 201 to generate data defining windings for an electromagnet coil. The data (e.g. defining the positions in three dimensions of the windings) can then be employed to manufacture and assemble the relevant coil onto a housing or other support structure as a component of the system 100. As will be discussed below, the process implemented by the computing device 201 optimizes various attributes of the coil under design to reduce or eliminate mutual inductance between the coil under design and one or more other coils.

At block 305, the computing device 201 (e.g. via execution of the application 212 by the processor 202) is configured to generate a coil surface representation for use in the coil design process. For example, the computing device 201 may be provided (e.g. via the above-mentioned input assembly) with a definition of a volume of interest where the field from the coil being designed will be generated. The volume of interest typically corresponds to a volume within a bore of the main magnet 110. The coil surface is a surface of arbitrary shape upon which the windings of the coil being designed are placed. The coil surface need not represent a physical surface that will be present in the system 100, although generally the system 100 includes a support structure for the coil that corresponds to the coil surface represented at block 305.

Figure 4:
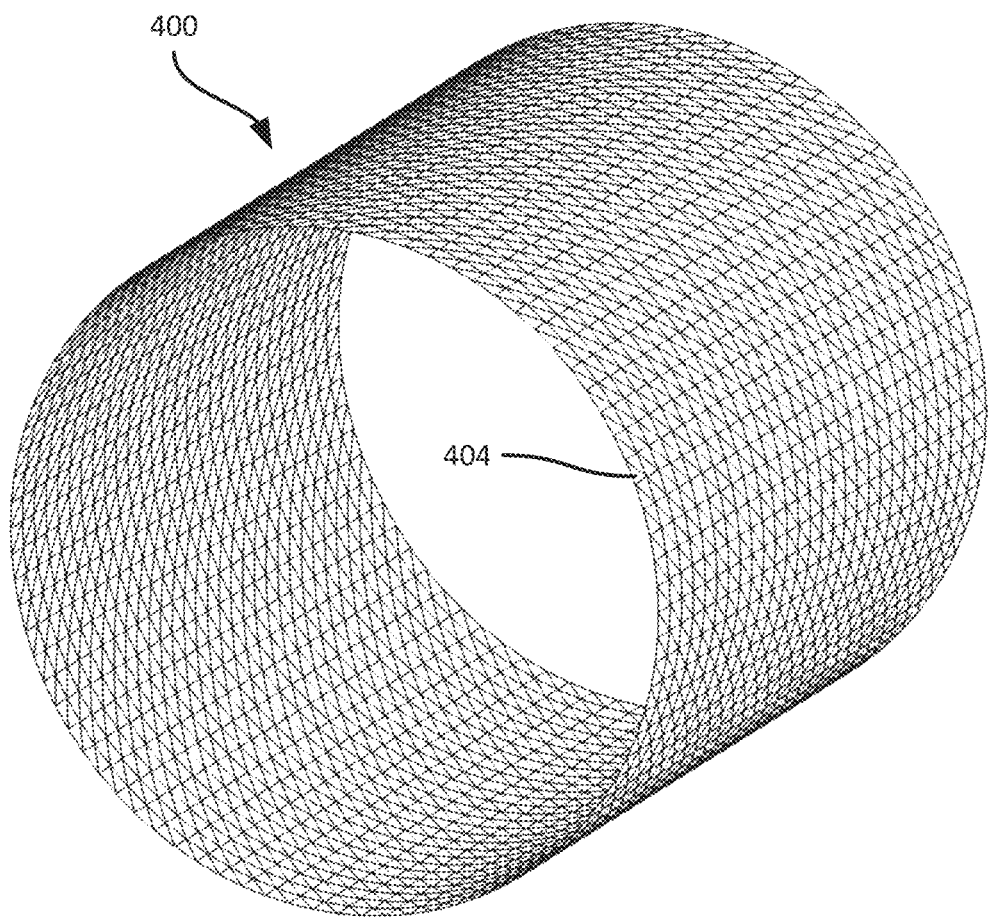
FIG. 4 is a diagram illustrating a triangular mesh employed to represent a coil surface.

In the present example, the boundary element method (BEM) is employed for coil design. In the BEM process, the coil surface is represented as a plurality of discrete elements, such as a mesh of triangular surfaces. The coil surface representation, in other words, is such a mesh. FIG. 4 illustrates an example coil surface representation 400 consisting of a mesh of triangular elements 404, assuming that the coil surface is cylindrical. As will be apparent to those skilled in the art, the BEM process includes modeling current density for each of the elements 404. In particular, based on various input parameters, current density data is generated for each element 404 that includes a direction and magnitude of current density. The current density data may be manipulated and further processed to select winding positions for the coil.

Returning to FIG. 3, at block 310, the computing device 201 is configured to define a set of at least one performance metric function. The set includes at least a mutual inductance function that defines mutual inductance between the electromagnet coil to be designed via the process of the method 300, and a second electromagnet coil. The second electromagnetic coil may be, for example, another shim coil 140 or the like. The second coil may also be referred to as a target coil. The target coil is assumed to have been previously designed, and thus the position and orientation of the windings of the target coil are defined, e.g. in the repository 216. The computing device 201 can therefore be configured, in order to generate the mutual inductance function, to obtain winding data for the target coil at block 307, e.g. by retrieving the winding data from the repository 216.

The performance metric functions, in general, are functions that each accept various inputs and generate, as an output, a performance metric for the coil to be designed. As will be discussed below, the design parameters of the coil are selected to optimize the set of performance metrics, with the performance metric functions acting as feedback to such an optimization process.

Various examples of performance metrics will occur to those skilled in the art. For example, the performance metric functions defined at block 310 can include a field-shape metric, e.g. for gradient coils 120. For gradient coils 120, magnetic field gradient linearity and uniformity may be targeted performance attributes. The field-shape metric is a measure of how well the field that the coil to be designed (e.g. a gradient coil 120) produces matches a target field. The field-shape metric can be defined in various ways. For example, the field-shape metric function can include the sum of the squared difference between the field that is produced by the coil under design and the target field over a set of positions (e.g. the elements 404 of the BEM surface representation 400) in a volume of interest. The design parameters of the coil may be optimized to reduce the field-shape metric, resulting in a closer alignment between the target field and the actual field produced by the coil under design.

Another example of a performance metric is a field strength metric. The field strength metric function defined at block 310 may therefore include a function that varies with the difference between the actual field strength over a set of positions (e.g. the elements 404) and a target field strength. Thus, the design parameters of the coil may be optimized to reduce the field strength metric.

As noted above, the performance metric functions defined at block 310 in this embodiment include at least one mutual inductance function. The mutual inductance function defines, e.g. over a set of positions on the coil surface representatio 400, the mutual inductance between the designed coil and the target coil. The mutual inductance function can be, for example, a vector that represents the mutual inductance between the surface representation 400 and the wire pattern of the target coil (e.g. a gradient coil 120, another shim coil 140, or the like) obtained at block 307. The mutual inductance vector can be calculated via the equation below:

$$M_n \approx \frac{\mu_0}{4\pi I_s} \int \int_{S\ S'} \frac{J_{in}(r) \cdot J_s(r')}{|r_{in} - r'_s|} dS' dS \quad \text{(equation 1.0)}$$

where $I_s$ is the current amplitude being driven through the target coil current element array, $J_{in}(r)$ is the set of current basis functions for the finite element surface, $J_s(r')$ is the current density (wire pattern) of the target coil, and $|n_{in}-r'_s|$ is the distance between the node n and the target coil current density. Various other representations of mutual inductance may also be employed, in other implementations.

In some examples, the set of performance metric functions defined at block 310 can include a plurality of mutual inductance functions. For example, a plurality of distinct target coils can be retrieved at block 307, and thus a distinct mutual inductance function can be defined at block 310 for each pair of the designed coil and a target coil.

Further, at block 310 a plurality of mutual inductance functions can be defined for a given target coil. Specifically, as mentioned earlier, manufacturing and/or assembly tolerances may result in the relative placement of the designed coil and the target coil deviating from the designed relative placement. At block 310, therefore, at least one additional mutual inductance function may be defined for the same target coil, with a variation in the placement of the target coil relative to the coil surface representation. For example, a set of mutual inductance functions may be defined for a given target coil, with one such function corresponding to the ideal (designed) placement of the target coil relative to the coil surface representation, and other mutual inductance functions corresponding to shifted placements of the target coil (e.g. shifts in one or both directions along the Z axis shown in FIG. 2A, rotation about the Z axis, and the like).

As will now be apparent, some performance metrics may conflict with others, in that a reduction of one performance metric may be accompanied by an increase in another performance metric. The optimization of the coil design parameters therefore aims to balance minimization of the various performance metric functions defined at block 310. To that end, at block 315 the computing device 201 is configured to define a performance functional. The performance functional, as will be apparent to those skilled in the art, is based on the performance metric functions defined at block 310 (e.g. the performance functional may employ the performance metric functions as inputs). The performance functional, in other words, generates output that is representative of the set of performance metrics from block 310 as a whole.

The performance metric functions from block 310 may be integrated into the performance functional with weighting parameters in some examples. For example, mitigation of mutual inductance may be given an elevated importance by associating a greater weighting parameter with the mutual inductance function(s) than with other performance metric functions. In some examples, the performance functional may include constraints on any of the performance metric functions, including the mutual inductance function(s). For example, a mutual inductance function may be integrated into the performance functional with a constraint that mutual inductance remain within a certain range of values, below a threshold, or the like. In some examples, a constraint may be applied that the mutual inductance be null (i.e. zero mutual inductance between the designed coil and the target coil).

At block 320, the computing device 201 is configured to generate a current density pattern over the coil surface representation 400 based on the performance functional. That is, a selected set of inputs to the performance functional are employed by the computing device 201 to compute current density information for each element 404 of the surface representation 400.

At block 325, the performance functional is updated, e.g. by varying the input parameters thereto. The output of the performance functional, generated from the current density pattern from block 320, represents the set of performance metric functions from block 310. That is, the output of performance functional from the current iteration of the current density pattern is indicative of the levels of the various performance metrics. The performance functional may therefore be updated to minimize that output. The performance of blocks 320 and 325 may therefore be repeated, as shown by the dashed line from block 325 to block 320, to optimize (e.g. minimize) the output of the performance functional.

As will be apparent to those skilled in the art, the current density pattern generated at block 320 may be represented as a scalar stream function. The stream function can be represented as a piece-wise linear (or higher order) function over the surface geometry represented by the coil surface representation 400. The stream function can consist of a single scalar value for each node (e.g. each vertex in the triangular mesh) and when all of the nodes are considered together, the stream function can be transformed to find the direction and magnitude of the current density in each triangular element.

In one implementation, a stream function, $\psi(r)$, residing within the surface of elements with corresponding current density $J(r)$ can be defined, where r represents the position on the mesh. The stream function can be approximated by a weighted sum of basis functions for each node n as:

$$\psi(r) = \sum_{n=1}^{N} I_n \psi_n(r) \quad \text{(equation 1.1)}$$

In equation 1.1, In is the weighting coefficient for the basis function $\psi n(r)$ of node n. With this approximation, the current density for the stream function can be represented as a sum of current density basis functions, defined as:

$$J(r) = \nabla \times [\psi(r)n(r)] \quad \text{(equation 1.2)}$$

$$J(r) \approx \sum_{n=1}^{N} I_n \nabla \times [\psi_n(r)n(r)] \quad \text{(equation 1.3)}$$

$$J(r) \approx \sum_{n=1}^{N} I_n J_n(r) \quad \text{(equation 1.4)}$$

$$J_n(r) \approx \sum_{k=1}^{K} v_{nk} = \sum_{k=1}^{K} \frac{e_{nk}}{2A_k} \quad \text{(equation 1.5)}$$

In equations 1.2 through 1.5, n(r) is the outward pointing normal of the surface, K is the number of triangles surrounding node n, $A_k$ is the area of triangular element k associated with node n, and $e_n k$ is the vector that opposes node n within triangular element k.

The computing device 201 may determine that the performance functional is optimized, for example, when the output of the performance functional is below a threshold (e.g. sufficiently minimized). When that determination is affirmative, the computing device 201 proceeds to block 330.

At block 330, the computing device 201 is configured to obtain coil winding data for the designed coil, from the current density pattern associated with the optimized performance functional. As will be apparent to those skilled in the art, obtaining coil windings from the current density pattern can include contouring the current density pattern, e.g. by processing the above-mentioned stream function. In general, the performance of block 330 can therefore include applying contouring parameters to the stream function, such as a spacing between coil wires or density of coil wires, and the like.

The computing device 201 may also be configured to apply a plurality of contouring parameters at block 330, and to assess the windings obtained with each set for mutual inductance (whether via the same mutual inductance function as noted above, or a distinct mutual inductance function suited to application to specific wire patterns). For example, at block 330 the computing device 201 can generate a plurality of winding sets, and select the winding set with the lowest mutual inductance relative to the target coil.

Figure 5:
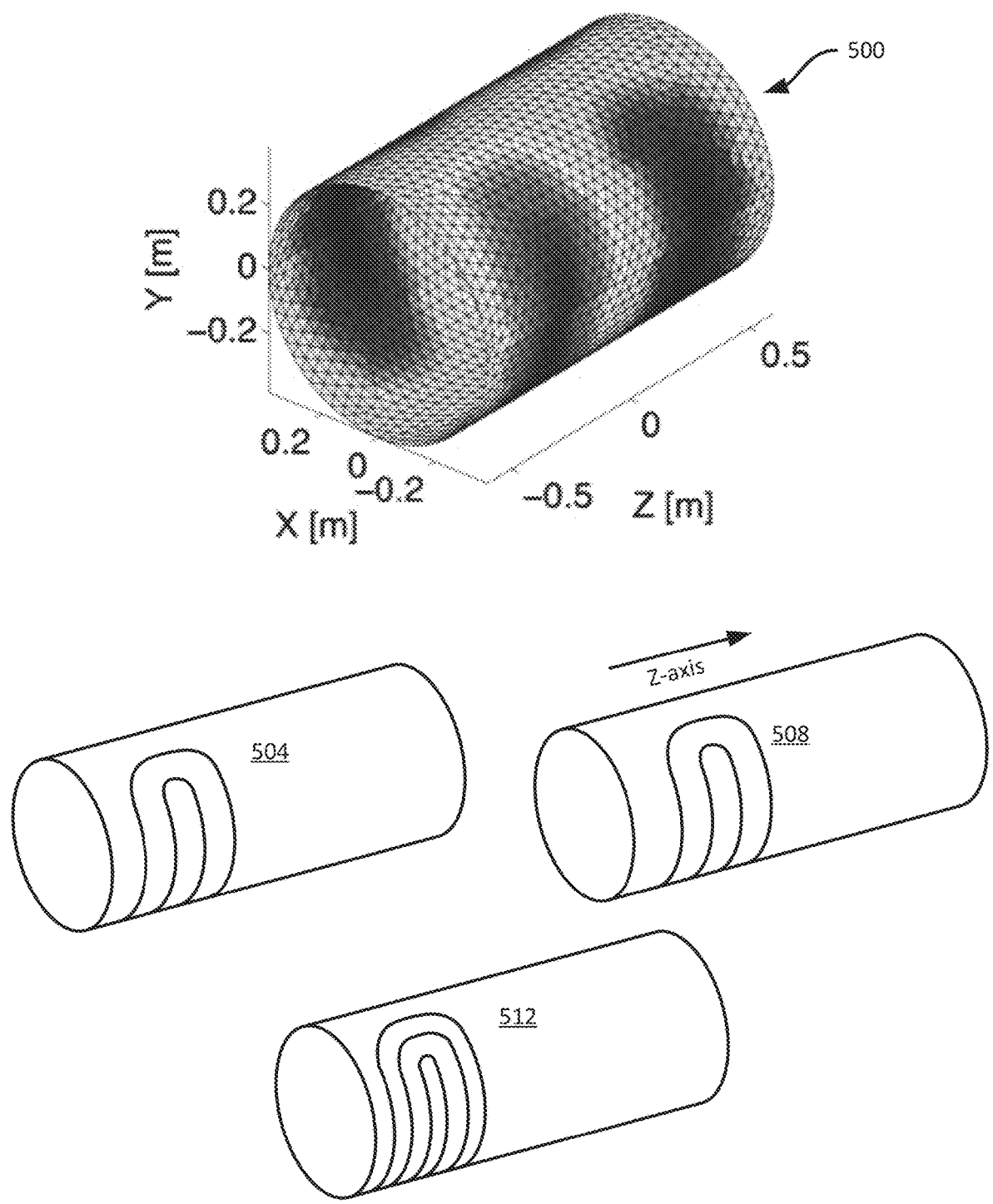
FIG. 5 is a diagram illustrating a current density pattern, and example coil windings generated therefrom.

Turning to FIG. 5, an example current density pattern 500 over the surface representation 400 is illustrated, following optimization of the performance functional. In addition, three example (partial) coil windings 504, 508, and 512 are shown, resulting from the application of different contouring parameters to the pattern 500 (or a stream function corresponding to the pattern 500). The windings 508, for example, are offset along the Z axis from the windings 504, and the windings 512 have a greater wire density than the windings 504 and 508. From the windings 504, 508, and 512, the computing device 201 may select the windings with the least mutual inductance.

Figure 6:
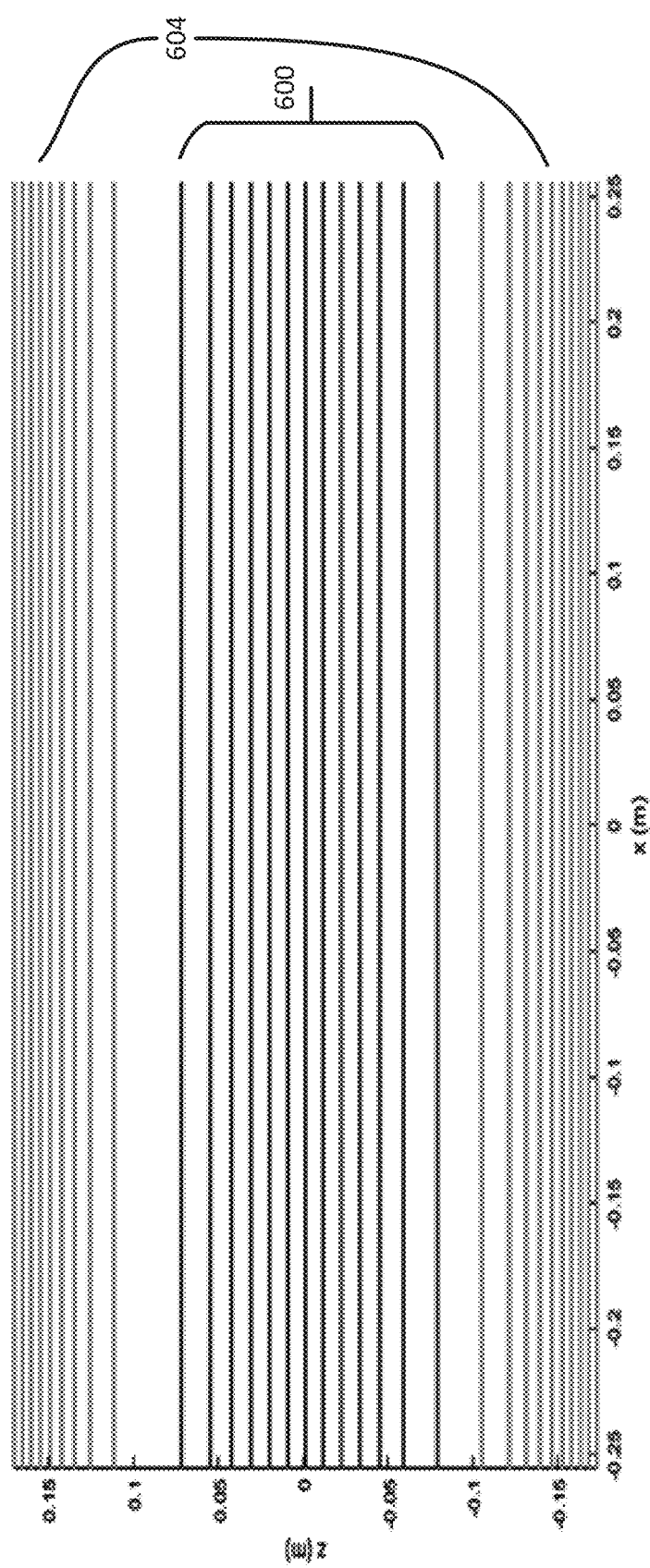
FIG. 6 is a diagram illustrating a side view of coil windings obtained without the consideration of mutual inductance as in the method of FIG. 3.
Figure 7:
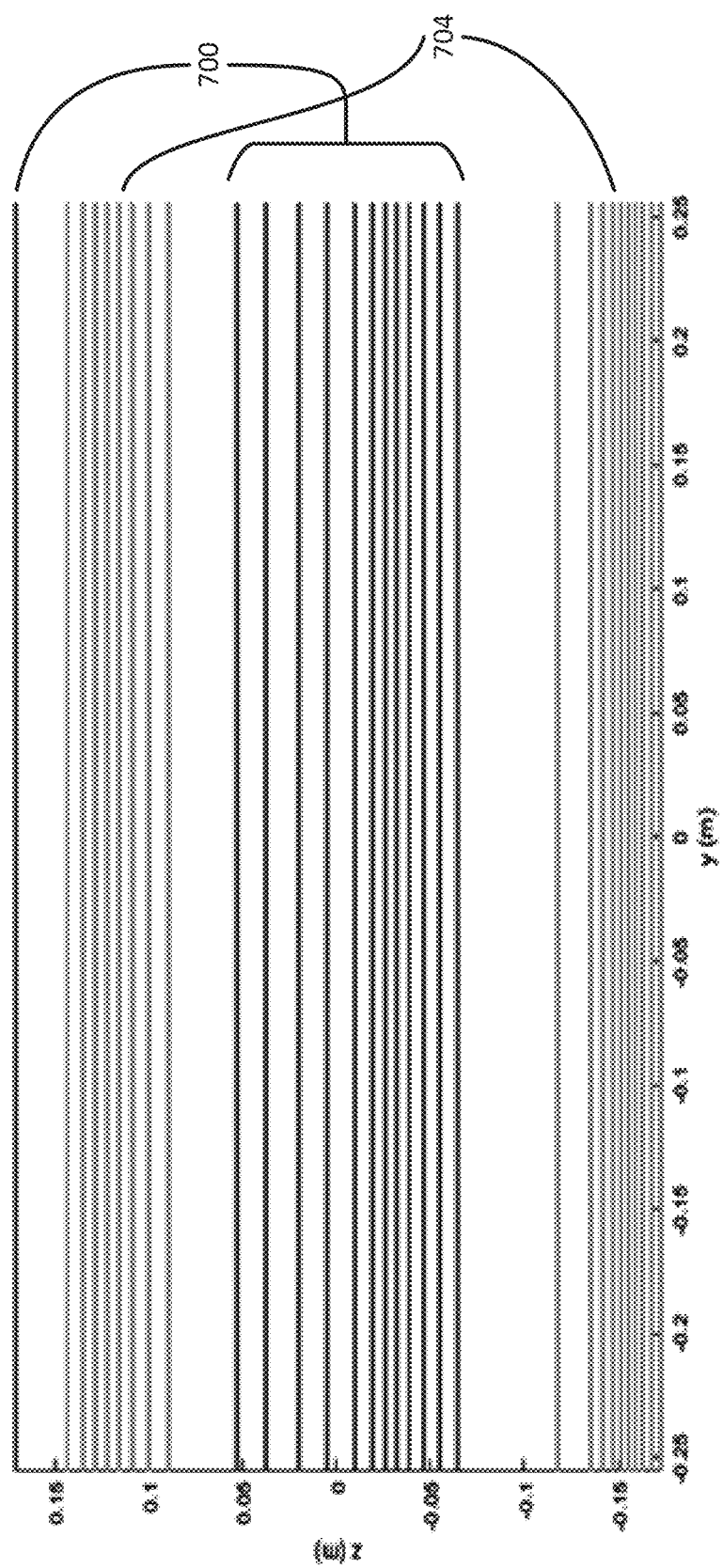
FIG. 7 is a diagram illustrating a side view of coil windings obtained via the method of FIG. 3, accounting for mutual inductance.

FIG. 6 illustrates example winding sets, e.g. for a Z2 shim coil, designed without the use of the mutual inductance performance metric discussed above. The example windings include a set 600 and a set 604. FIG. 7 illustrates a further Z2 shim coil arising from the process discussed above (i.e. use of the method 300 to design the coil). The sets 700 and 704 of windings shown in FIG. 7 have similar performance metrics to those of FIG. 6, with the exception of mutual inductance. The sets in FIG. 7 have a mutual modelled inductance electromotive force (EMF) of 0.004 V, in contrast to an EMF of 33 V for the sets of FIG. 6. In both cases, the target coil is a representative asymmetrical Z gradient coil driven by a representative amplifier (not shown).

The scope of the claims should not be limited by the embodiments set forth in the above examples, but should be given the broadest interpretation consistent with the description as a whole.

The invention claimed is:

1. A method of manufacturing an electromagnet coil for use in a magnetic resonance imaging (MRI) system, the method comprising:
generating a coil surface representation defining a surface to contain the electromagnet coil;
defining a set of performance metric functions, the set including aa first mutual inductance function defining mutual inductance between a first position of the electromagnet coil and a second electromagnet coil, and (ii) a second mutual inductance function defining mutual inductance between a second position of the electromagnet coil and the second electromagnet coil;
defining a performance functional based on the coil surface representation and the set of performance metric functions;
optimizing the performance functional;
generating a current density pattern over the coil surface representation based on the optimized performance functional; and
obtaining coil windings defining the electromagnet coil from the current density pattern.

2. The method of claim 1, wherein the set of performance metric functions further includes at least one of (i) a field shape function defining a degree of matching between a field shape of the electromagnet coil and a target field shape, and (ii) a field strength function.

3. The method of claim 1, wherein defining the performance functional includes setting a constraint on the mutual inductance function.

4. The method of claim 1, wherein defining the performance functional includes applying a weighting parameter to the mutual inductance function.

5. The method of claim 1, wherein the set of performance metric functions further includes another mutual inductance function corresponding to a third electromagnet coil.

6. The method of claim 1, wherein optimizing the performance functional includes minimizing the performance functional.

7. The method of claim 1, wherein obtaining the coil windings includes:
generating a stream function representing the current density pattern; and
selecting contours based on the stream function.

8. The method of claim 6, wherein obtaining the coil windings further includes:
iteratively adjusting at least one of a spacing of the contours and an offset of the contours relative to the stream function, to minimize the mutual inductance between the electromagnet coil and the second electromagnet coil.

9. A computing device for design of an electromagnet coil for use in a magnetic resonance imaging (MRI) system, the computing device comprising:
a memory; and
a processor configured to:
generate a coil surface representation defining a surface to contain the electromagnet coil;
define a set of performance metric functions, the set including aa first mutual inductance function defining mutual inductance between a first position of the electromagnet coil and a second electromagnet coil, and (ii) a second mutual inductance function defining mutual inductance between a second position of the electromagnet coil and the second electromagnet coil;
define a performance functional based on the coil surface representation and the set of performance metric functions;
optimize the performance functional;
generate a current density pattern over the coil surface representation based on the optimized performance functional; and obtain coil windings defining the electromagnet coil from the current density pattern.

10. The computing device of claim 9, wherein the set of performance metric functions further includes at least one of (i) a field shape function defining a degree of matching between a field shape of the electromagnet coil and a target field shape, and (ii) a field strength function.

11. The computing device of claim 9, wherein the processor is configured, to define the performance functional, to set a constraint on the mutual inductance function.

12. The computing device of claim 9, wherein the processor is configured, to define the performance functional, to apply a weighting parameter to the mutual inductance function.

13. The computing device of claim 9, wherein the set of performance metric functions further includes another mutual inductance function corresponding to a third electromagnet coil.

14. The computing device of claim 9, wherein the processor is configured, to optimize the performance functional, to minimize the performance functional.

15. The computing device of claim 9, wherein the processor is configured, to obtain the coil windings, to:
   generate a stream function representing the current density pattern; and
   select contours based on the stream function.

16. The computing device of claim 15, wherein the processor is further configured, to obtain the coil windings, to:
   iteratively adjust at least one of a spacing of the contours and an offset of the contours relative to the stream function, to minimize the mutual inductance between the electromagnet coil and the second electromagnet coil.

17. A non-transitory computer-readable medium storing a plurality of instructions executable by a processor of a computing device to:

generate a coil surface representation defining a surface to contain an electromagnet coil for use in a magnetic resonance imaging (MRI) system;

define a set of performance metric functions, the set including aa first mutual inductance function defining mutual inductance between a first position of the electromagnet coil and a second electromagnet coil, and (ii) a second mutual inductance function defining mutual inductance between a second position of the electromagnet coil and the second electromagnet coil;

define a performance functional based on the coil surface representation and the set of performance metric functions;

optimize the performance functional;

generate a current density pattern over the coil surface representation based on the optimized performance functional; and obtain coil windings defining the electromagnet coil from the current density pattern 1, A method of manufacturing an electromagnet coil for use in a magnetic resonance imaging (MRI) system, the method comprising:

generating a coil surface representation defining a surface to contain the electromagnet coil;

defining a set of performance metric functions, the set including a mutual inductance function defining mutual inductance between the electromagnet coil and a second electromagnet coil;

defining a performance functional based on the coil surface representation and the set of performance metric functions;

optimizing the performance functional;

generating a current density pattern over the coil surface representation based on the optimized performance functional; and obtaining coil windings defining the electromagnet coil from the current density pattern.

\* \* \* \* \*